United States Patent [19]

Momose

[11] Patent Number: 5,497,014
[45] Date of Patent: Mar. 5, 1996

[54] BI-CMOS GATE ARRAY SEMICONDUCTOR INTEGRATED CIRCUITS AND INTERNAL CELL STRUCTURE INVOLVED IN THE SAME

[75] Inventor: Takayuki Momose, Kanagawa, Japan

[73] Assignee: NEC Corporation, Tokyo, Japan

[21] Appl. No.: 300,132

[22] Filed: Sep. 2, 1994

[30] Foreign Application Priority Data

Sep. 3, 1993 [JP] Japan .................................. 5-219386

[51] Int. Cl.$^6$ ............................ H01L 27/10; H01L 29/76
[52] U.S. Cl. .......................... 257/205; 257/204; 257/206; 257/370
[58] Field of Search ................................. 257/205, 206, 257/204, 370

[56] References Cited

FOREIGN PATENT DOCUMENTS 63-140  1/1988  Japan ..................................... 257/205

*Primary Examiner*—Steven H. Loke
*Attorney, Agent, or Firm*—Young & Thompson

[57] ABSTRACT

The invention provides a Bi-CMOS gate array semiconductor integrated circuit chip including a peripheral region including an input/output circuit region and a bonding pad region and an internal cell structure provided within an internal cell region involved in the semiconductor integrated circuit chip. The internal cell structure comprises MOS transistor cell units including a plurality of MOS transistors and bipolar transistor cell units including a plurality of bipolar transistors wherein a distribution ratio in the number of the MOS transistor cell units to the bipolar transistor cell units has such a variation that the distributed ratio is high in a region that requires driving of almost no or a small load while the distributed ratio is low in a region that requires driving of a large load.

14 Claims, 7 Drawing Sheets

5,497,014

BI-CMOS GATE ARRAY SEMICONDUCTOR INTEGRATED CIRCUITS AND INTERNAL CELL STRUCTURE INVOLVED IN THE SAME

BACKGROUND OF THE INVENTION

The invention relates to Bi-CMOS gate array semiconductor integrated circuits, and more particularly to internal cell structures involved in the Bi-CMOS gate array semiconductor integrated circuits.

The Bi-CMOS gate array semiconductor integrated circuits have been known in the art, to which the invention pertains. Typical one of the conventional gate array semiconductor integrated circuits will be described with reference to FIG. 1. A large scale integrated circuit (LSI) chip 20 has a square-shaped internal cell region 2 at its center area and a peripheral region surrounding the internal cell region 2. The peripheral region of the LSI chip 20 comprises an input/output circuit region 6 surrounding the internal cell region 2 and a bonding pad region 7 surrounding the input/output circuit region 6. The bonding pad region 7 includes discontinuous alignments of a plurality of bonding pads along each side of the LSI chip 20, while the input/output circuit region 6 includes continuous alignments of a plurality of input/output circuits.

The internal cell region 2 has a matrix structure of a plurality of internal cells 1. The individual internal cells 1 have the same structure as illustrated in FIG. 2. For example, each of the internal cells 1 comprises two NPN bipolar junction transistors 21 and 22 showing a high driving ability, CMOS transistors comprising a pair of n-channel and p-channel MOS transistors 14 and 15 showing a digital processing at an extremely low power consumption, an n-channel MOS transistor 16 and a resistor 17. The paired p-channel and n-channel MOS transistors 14 and 15 constituting the CMOS transistors have channel widths of 30 micrometers and 10 micrometers respectively, while the non-paired n-channel MOS transistor 16 has a width of 30 micrometers. The circuit configuration of the above elements constituting the each internal cell 1 is as illustrated in FIG. 3. The each internal cell includes input and output lines as well as high and low voltage lines. The p-channel MOS transistor 14 has a gate connected to the input line, and a source connected to the high voltage line. The n-channel MOS transistor 15 has a gate connected to the input line, a drain connected to the drain of the p-channel MOS 14 and a source being grounded. The n-channel MOS transistor 16 has a gate connected to the input line, a source connected to a resistor and a drain connected to the output line. The resistor is also connected to a low voltage line at its opposite side to the side connected to the source of the p-channel MOS transistor 14. The bipolar transistor 21 has a base connected to the drains of the CMOS transistors 14 and 15, a collector connected to the high voltage line and an emitter connected to the output line, while the bipolar transistor 22 has a base connected to the source of the n-channel MOS transistor 16, a collector connected to the output line and an emitter connected to the low voltage line.

As described above, the conventional Bi-CMOS gate array semiconductor integrated circuit chip 20 includes the internal cell region having the plural internal cells with the same or uniform cell structure, namely the each internal cells have at least the CMOS transistors and the bipolar transistors. Such internal cell structure, however, provides disadvantages as described below.

The bipolar transistor having a high driving ability is needed only in a region having a large load capacitance or a high wiring resistance. Almost all of the Bi-CMOS gate array large scale integrated circuits includes such region as having a large load capacitance or a high resistance such as appreciable wiring resistance in which the bipolar transistors are not needed, although the all internal cells has the same cell structure including at least the CMOS transistors and the bipolar transistors. This results in that the conventional Bi-CMOS gate array large scale integrated circuits includes unnecessary bipolar transistors located in a logic circuit region free from any requirement for the driving of the load capacitance or the resistance in which MOS transistors only are required for logic operations. Such unnecessary bipolar transistors involved in the logic circuit region free from the requirement for the driving of the load capacitance or the wiring resistance necessarily results in a considerable enlargement in a size of the Bi-CMOS gate array integrated circuit chip. In view of saving the integrated circuit chip area, it is required to achieve a possible curtailment of the unnecessary bipolar transistor located in the logic circuit region free from any requirement for the driving of the load capacitance and the wiring resistance.

The conventional internal cell structure further provides disadvantages in a large power consumption. The bipolar transistor requires a large power as compared to the CMOS transistor. In view of saving the power consumption of the integrated circuit ship, it is also required to achieve a possible curtailment of the unnecessary bipolar transistors that show the relatively large power consumption.

The conventional internal cell structure further more provides disadvantages in an enlargement of a delay of time in processing. The bipolar transistor has a delay in time for driving the driving circuits. The internal cell structure involving the unnecessary driving circuits including the bipolar transistors results in a large delay in time for driving the driving circuit, resulting in a difficulty in allowing the Bi-CMOS gate arrays integrated circuits to show a high speed processing.

The disadvantages as mentioned above are serious particularly in a small load capacitance and in a complex circuit configuration.

In conclusion, the uniform cell structure throughout the integrated circuit chip are undesirable in view of reducing the area of the integrated circuit chip, saving the power consumption and preventing any delay in time for driving the driving circuits.

SUMMARY OF THE INVENTION

Accordingly, it is a primary object of the present invention to provide a novel internal cell structure for semiconductor integrated circuits, which is free from any disadvantages as described above.

It is a further object of the present invention to provide a novel internal cell structure for semiconductor integrated circuits, which permits a considerable curtailment of an area of an internal cell region involved in the integrated circuits.

It is a further more object of the present invention to provide a novel internal cell structure for semiconductor integrated circuits, which permits a considerable reduction of a power consumption by the internal cells involved in the integrated circuits.

It is a moreover object of the present invention to provide a novel internal cell structure for semiconductor integrated circuits, which permits a considerable reduction of a time delay for driving load driving circuits in the internal cells involved in the integrated circuits.

It is a still further object of the present invention to provide semiconductor integrated circuits including a novel internal cell structure which permits a considerable curtailment of an area of an internal cell region involved in the integrated circuits.

It is yet a further object of the present invention to provide semiconductor integrated circuits including a novel internal cell structure which permits a considerable reduction of a power consumption by the internal cells involved in the integrated circuits.

It is an additional object of the present invention to provide semiconductor integrated circuits including a novel internal cell structure which permits a considerable reduction of a time delay for driving load driving circuits in the internal cells involved in the integrated circuits.

The above and other objects, features and advantages of the present invention will be apparent from the following descriptions.

The invention provides a Bi-CMOS gate array semiconductor integrated circuit chip including a peripheral region including an input/output circuit region and a bonding pad region and an internal cell structure provided within an internal cell region involved in the semiconductor integrated circuit chip. The internal cell structure comprises MOS transistor cell units including a plurality of MOS transistors and bipolar transistor cell units including a plurality of bipolar transistors wherein a distribution ratio in the number of the MOS transistor cell units to the bipolar transistor cell units has such a variation that the distributed ratio is high in a region that requires driving of almost no or a small load while the distributed ratio is low in a region that requires driving of a large load. The high distributed ratio region has an extremely large number of the MOS transistor cell units and an extremely small number of the bipolar transistor cell units, while the low distributed ratio region has substantially the same number of the MOS transistor cell units and the bipolar transistor cell units. The internal cell region may comprises a first region having a high distributed ratio in the number of the MOS transistor cell units to the bipolar transistor cell units, a second region having an intermediate distributed ratio in the number of the MOS transistor cell units to the bipolar transistor cell units, a third region having a low distributed ratio in the number of the MOS transistor cell units to the bipolar transistor cell units.

BRIEF DESCRIPTIONS OF THE DRAWINGS

Preferred embodiments of the present invention will hereinafter fully be described in detail with reference to the accompanying drawings.

DESCRIPTIONS OF THE INVENTION

Figure 1:
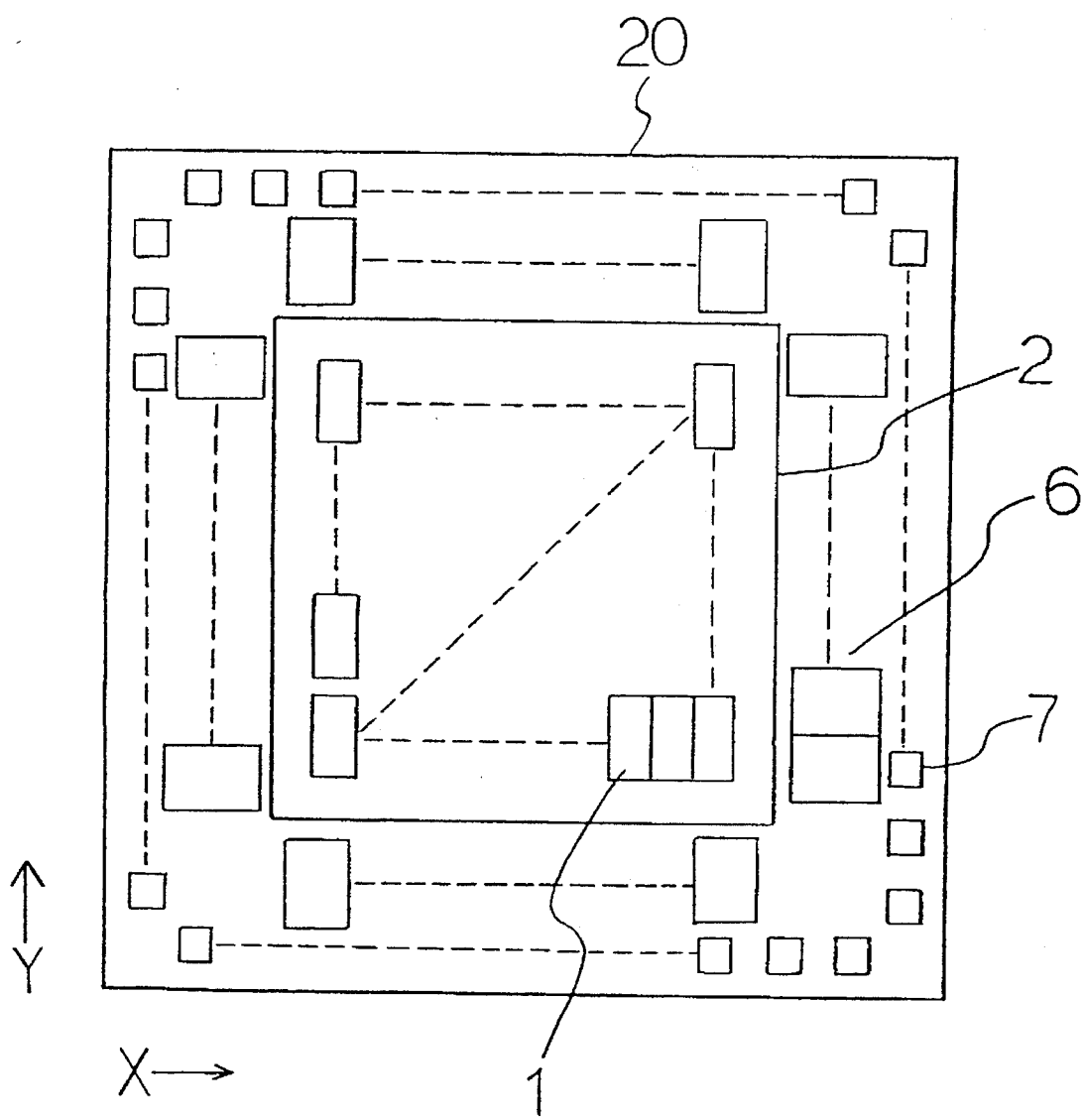
FIG. 1 is a diagram illustrative of the conventional Bi-CMOS gate arrays LSI chip.
Figure 2:
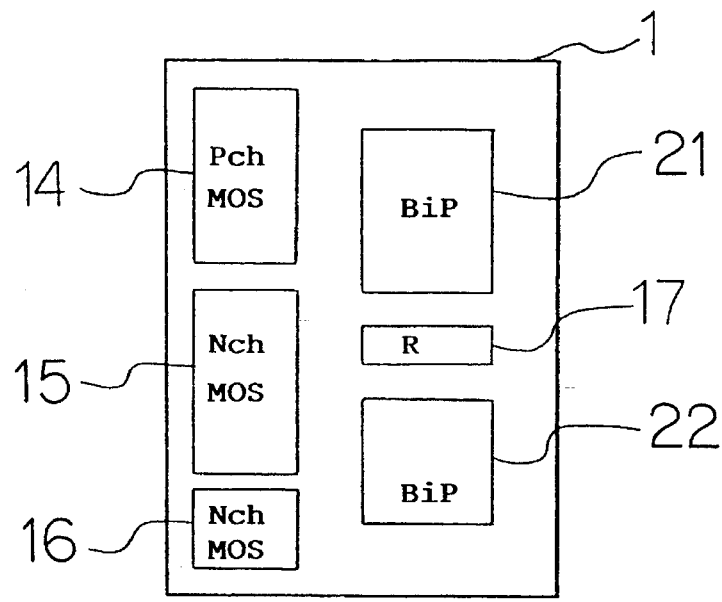
FIG. 2 is a diagram illustrative of the conventional internal cell structure involved in the Bi-CMOS gate arrays LSI chip illustrated in FIG. 1.
Figure 3:
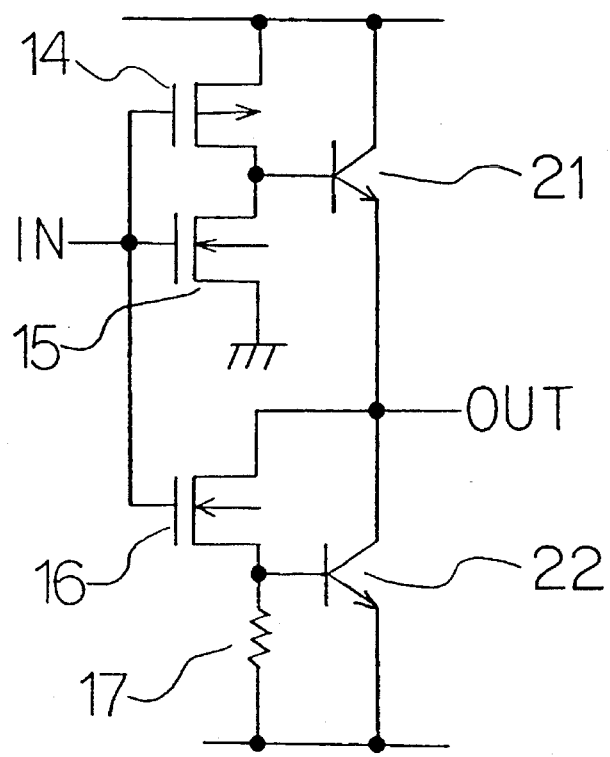
FIG. 3 is a circuit diagram of internal cells illustrated in FIG. 2.

The invention provides a novel internal cell structure for a Bi-CMOS gate array semiconductor integrated circuit chip in which the chip has an internal cell region divided into a plurality of different regions with different internal cell structures. The internal cell region may, for example, be divided into a logic circuit region and a load capacitance and high resistance region. The logic circuit region includes almost only MOS transistors, particularly CMOS transistors showing logic operations, while the load capacitance and high resistance region includes not only the MOS transistors such as CMOS transistors but also bipolar transistors for driving the load capacitance and wiring resistances so as to the internal cell region to have none of any unnecessary bipolar transistors and resistances. Namely, the bipolar transistors are provided only in a region having the load capacitance and resistance such as the wiring resistance, while almost no bipolar transistor nor resistance is provided in a logic circuit region. Needless to say, it is possible to divide the internal cell region into more than two different internal cell structure regions in which a ratio in the number of the MOS transistors such as CMOS transistors to the bipolar transistors is different or varied in every different internal cell structure regions. The number of kinds of the different internal cell structure regions is variable to match the requirement for various type integrated circuits. Of course, distributions of the individual different internal cell structure regions on the semiconductor integrated circuit chip are also variable to adjust the requirement for various type integrated circuit chips. The different internal cell structures, in which the ratio in the number of the CMOS transistors to the bipolar transistors is different in every different internal cell structure regions, may provide advantages as mentioned below.

The bipolar transistors are provided only in the load capacitance and resistance region. Namely the load capacitance and resistance region includes not only the CMOS transistors for performing the logic operation but also the necessary bipolar transistors for driving the load capacitance and the wiring resistance, while the logic circuit region includes a large number of the CMOS transistors and almost no or less bipolar transistor nor resistance. The internal cell structures includes none of any unnecessary bipolar transistors nor resistance. Such the internal cell structure may provide a considerable curtailment of an area of the internal cell region involved in the Bi-CMOS gate array semiconductor integrated circuit chip as each bipolar transistor has an appreciable occupied area and a great number of the bipolar transistors are reduced. Such internal cell structure may provide a possible curtailment of a power consumption by the integrated circuit chip as a large number of the bipolar transistor is reduced. Such internal cell structure may also prevent any delay in time of driving the driving circuits having the load capacitance and the resistance. The conventional internal cell structure includes a relatively large number of the bipolar transistors which are not effectively used, while all of the bipolar transistors are effectively used in the novel internal cell structure according to the present invention. The novel internal cell structure may permit the defined internal cell region to have a much more CMOS transistors for logic operations.

According to the present invention even if the internal cell region includes a fewer number of bipolar transistors which are non-operational as bipolar transistors, such not operational bipolar transistors may be used as a capacitor arranged between high and low voltage lines involved in the integrated circuits. In this case, such non-operational bipolar transistors have a gate connected to the low voltage line and source and drain, both of which are connected to the high voltage line. Such bipolar transistors may serve as capacitors which provide a stability to the power.

Figure 4:
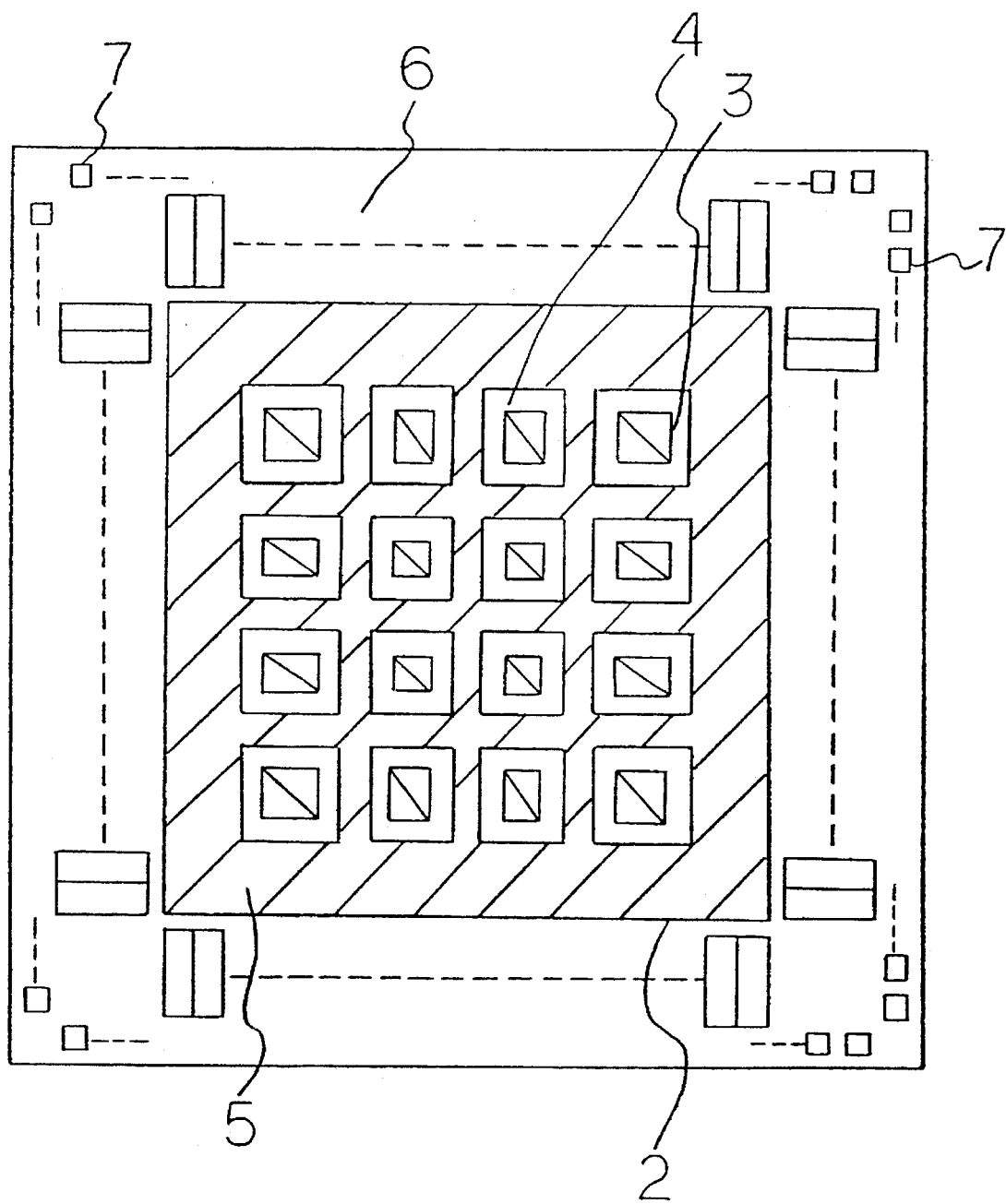
FIG. 4 is a diagram illustrative of a Bi-CMOS gate array LSI chip including a novel internal cell structure in an internal cell region involved in a Bi-CMOS gate array semiconductor integrated circuits in a first embodiment according to the present invention.

A first embodiment according to the present invention will be described in detail with reference to FIG. 4 in which a novel internal cell structure is provided for the Bi-CMOS gate array semiconductor integrated circuit chip.

The Bi-CMOS gate array semiconductor integrated circuits has a square-shaped internal cell region 2 at its center area and a peripheral region surrounding the internal cell region 2. The peripheral region of the Bi-CMOS gate array semiconductor integrated circuit chip comprises an input/output circuit region 6 surrounding the internal cell region 2 and a bonding pad region 7 surrounding the input/output circuit region 6. The bonding pad region 7 includes discontinuous alignments of a plurality of bonding pads extending along each side of the chip, while the input/output circuit region 6 includes continuous alignments of a plurality of input/output circuits placed in parallel to the bonding pads.

The internal cell region 2 is divided into three regions or first to three regions 3, 4 and 5 having different internal cell structures from each other. The first internal cell structure regions 3 are distributed within the internal cell region 2 to form 4×4 matrix island arrays. The individual first internal cell structure regions 3 forming the 4×4 matrix island arrays are then spaced from one another. The individual first internal cell structure regions 3 may have various shapes and sizes, although the shape of each of the separately distributed first internal cell structure regions 3 is basically square or rectangular in various sizes. The second internal cell structure regions 4 are so distributed as to form square or rectangular shaped loop band regions being so located as to surround the square or rectangular shaped first internal cell structure regions forming the 4×4 matrix island arrays. The combinations of the first and second internal cell structure regions also constitute 4×4 matrix island arrays. The remaining region in the internal cell region 2 is shared by the third internal cell structure region 5 having mesh structures which isolate the 4× 4 matrix island arrays comprising the paired first and second internal cell structure regions 3 and 4 from each other. The mesh structure region of the third internal cell structure region 5 may correspond to mesh shaped wiring regions of the integrated circuits.

As described above, the first to third internal cell structure regions have the different cell structures from each other.

Figures 7A, 7B, 7C:
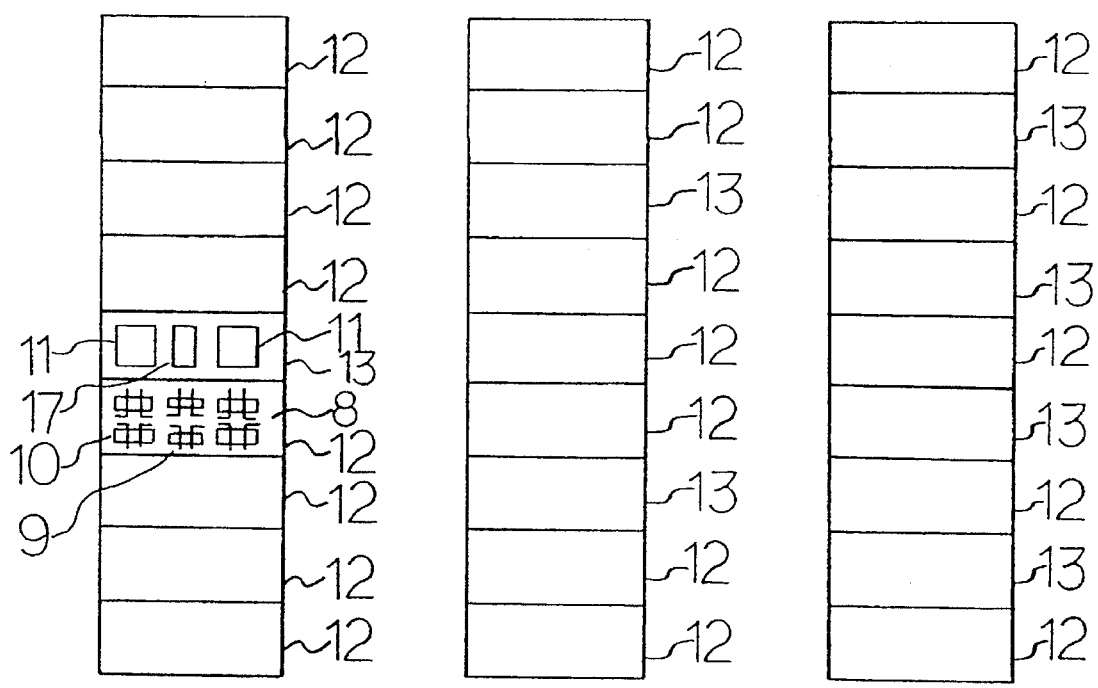
FIG. 7A to 7C are diagrams illustrative of first to third internal cell structures distributed in an internal cell region involved in a Bi-CMOS gate array semiconductor integrated circuits in first to third embodiments according to the present invention.

The first internal cell structure region 3 has a suitable cell structure for performing logic operations in condition of extremely low load capacitance. As illustrated in FIG. 7A, the first internal cell structure region 3 comprises a large number of CMOS transistor cell units 12 involving six MOS transistors including CMOS circuits for logic operation and a small number of bipolar transistor cell units 13. The first internal cell structure region 2 has a ratio of 8:1 in the number of the CMOS cell units 12 to the bipolar transistor cell units 13. The first internal cell structure is suitable for the logic operations in an extremely low power consumption necessary for driving a very small load capacitance.

As illustrated in FIG. 7B, the second internal cell structure region 4 comprises the CMOS transistor cell units 12 and the bipolar transistor cell units 13 in which the number of the CMOS transistor cell units 12 is larger than the number of the bipolar transistor cell units 13. The second internal cell structure 4 has a ratio of 7:2 in the number of the CMOS cell units 12 to the bipolar transistor cell units 13. The second internal cell structure is suitable for the logic operations in a relatively low power consumption necessary for driving a relatively small load capacitance.

As illustrated in FIG. 7C, the third internal cell structure region 5 comprises the CMOS transistor cell units 12 and the bipolar transistor cell units 13 in which the number of the CMOS transistor cell units 12 is almost equal or near to the number of the bipolar transistor cell units 13. The third internal cell structure region has a ratio of 5:4 in the number of the CMOS cell units 12 to the bipolar transistor cell units 13. The third internal cell structure is suitable for the logic operations in a high power consumption necessary for driving a large load capacitance.

Figure 8:
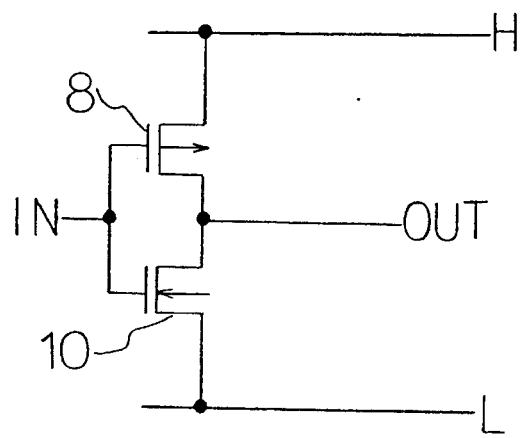
FIGS. 8A and 8B are circuit diagrams of internal cell structures illustrated in FIG. 7A and 7C respectively.
Figure 8:
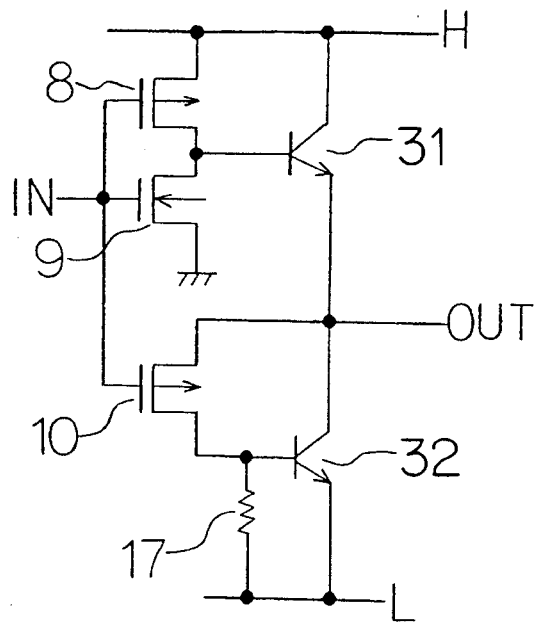

The majority of the first internal cell structure region 3 has a circuit configuration whose fragment is as illustrated in FIG. 8A in which paired p-channel and n-channel MOS transistors 8 and 10 constitute a CMOS circuit. The p-channel MOS transistor 8 has a gate connected to an input line, a source connected to a high voltage line and a drain connected to an output line, while the n-channel MOS transistor 10 has a gate connected to the input line, a source connected to a low voltage line and a drain connected to the output line.

Contrary to the above, the third internal cell structure region 5 has a circuit configuration as illustrated in FIG. 8B involving a CMOS circuit and a load driving circuit. For example, the circuit configuration of the third internal cell structure region comprises a pair of p-channel and n-channel MOS transistors 8 and 9 forming a CMOS circuit, a p-channel MOS transistor 10, two bipolar transistors 31 and 32 and a resistor 17. The p-channel MOS transistor 8 has a gate connected to an input line, a source connected to a high voltage line and a drain connected to a drain of the counterpart of the n-channel MOS transistor 9. The n-channel MOS transistor 9 has a gate connected to the input line, a source grounded and the drain connected to the drain of the p-channel MOS transistor 8. The p-channel MOS transistor 10 has a gate connected to the input line, a source connected through a resistor to a low voltage line and a drain connected to an output line. The bipolar transistor 31 has a base connected to the drains of the paired MOS transistors 8 and 9, a collector connected to the high voltage line and an emitter connected to an output line. The bipolar transistor 32 has a base connected to the source of the MOS transistor 10, a collector connected to the output line and an emitter connected to the low voltage line.

As described above, the first internal cell structure region 3 may preferably be allocated in the region conducting the logic operations in almost no or an extremely small power consumption due to driving almost no or a very low load resistance. The second internal cell structure region 4 may preferably be allocated in the region conducting the logic operations in a small power consumption due to driving a relatively low load resistance. By contrast, the third internal cell structure region 5 may preferably be allocated in the driving circuit region which requires the driving of the load capacitance or the resistance with a high power consumption for the logic operation. It could be appreciated from the above descriptions that the first and second internal cell structures includes a reduced number of the driving circuits involving the bipolar transistors and the resistor. This results in a considerable curtailment of an area of the internal cell region involved in the Bi-CMOS gate array semiconductor integrated circuit chip as a great number of the bipolar transistors sharing a relatively large area are reduced. This may permit a considerable increase of the number of the gate array logic circuits for the logic operation to replace the reduction of the considerable number of the bipolar transistors. Such internal cell structure may provide a considerable curtailment of a power consumption by the integrated circuit chip as a large number of the bipolar transistor are reduced. Particularly in the first and second internal cell structure regions 3 and 4, such internal cell structure may also prevent any delay in time of driving the driving circuits having the load capacitance and the resistance.

Figure 9:
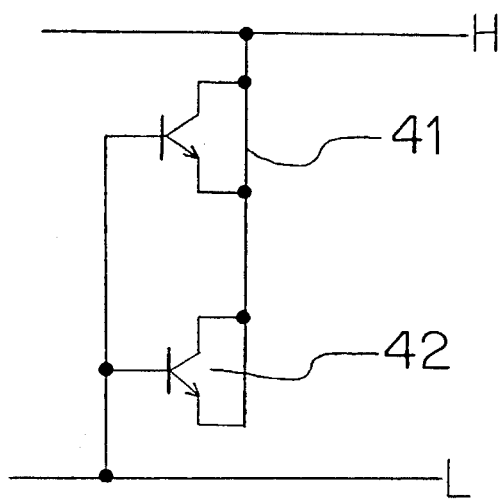
FIG. 9 is a circuit diagram of bipolar transistors acting as capacitors between high and low voltage lines.

Even if the internal cell region includes a fewer number of bipolar transistors which are not operational as bipolar transistors, such inoperational bipolar transistors may be used as a capacitor with a circuit configuration reversely biased between high and low voltage lines involved in the integrated circuits as illustrated in FIG. 9. The unoperational bipolar transistors acting as the capacitor has a base connected to the low voltage line and emitter and collector, both of which are connected to the high voltage line. The bipolar transistors acting as the capacitors may provide a stability to the power. From the above descriptions, it could be understood that the reversely biased bipolar transistors acting as the capacitors in the novel internal cell structure may provide substantially no inoperational nor unnecessary element such as bipolar transistor.

Figure 5:
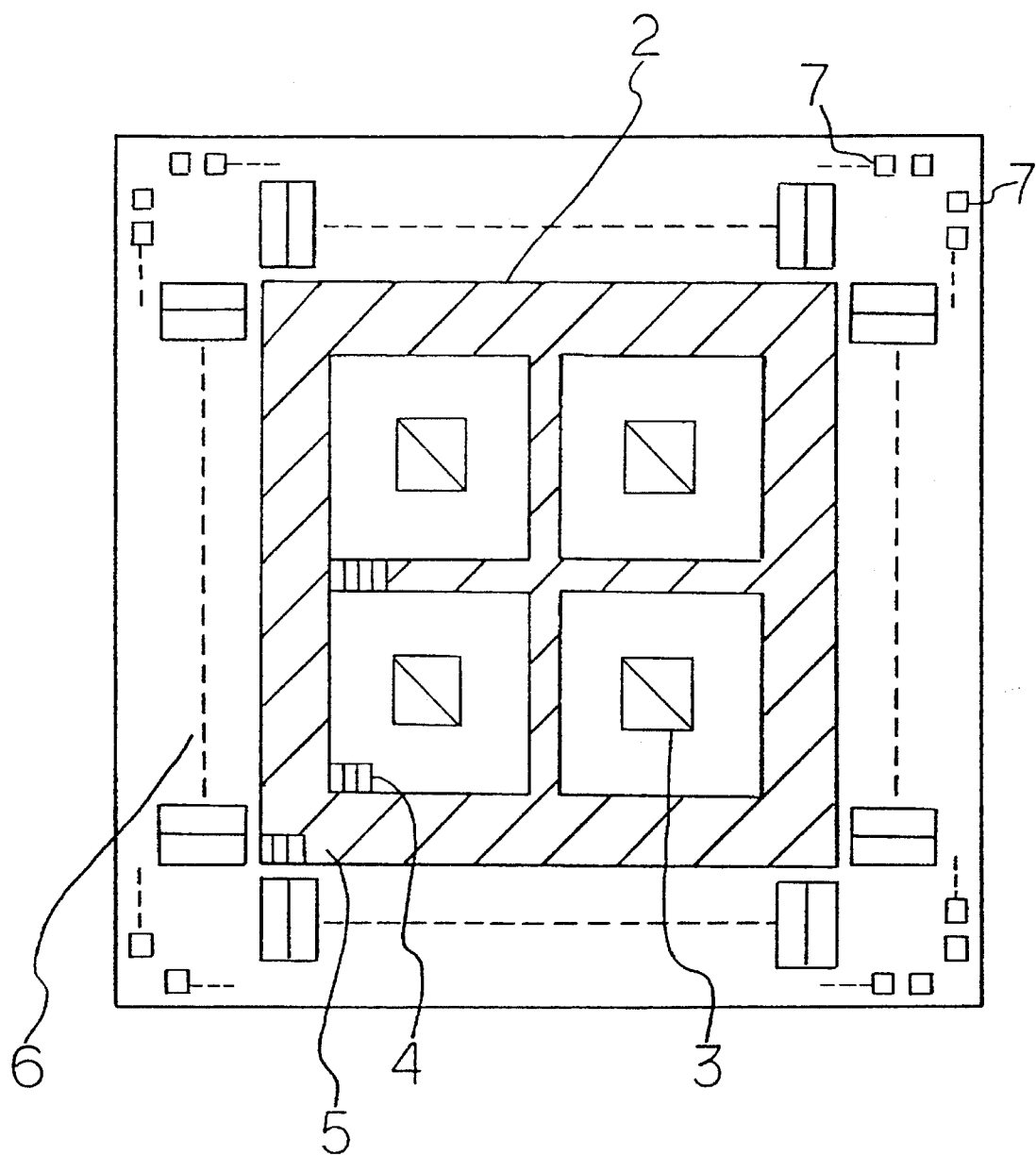
FIG. 5 is a diagram illustrative of a Bi-CMOS gate array LSI chip including a novel internal cell structure in an internal cell region involved in a Bi-CMOS gate array semiconductor integrated circuits in a second embodiment according to the present invention.

A second embodiment according to the present invention will be described in detail with reference to FIG. 5 in which a novel internal cell structure is provided for the Bi-CMOS gate array semiconductor integrated circuit chip.

The Bi-CMOS gate array semiconductor integrated circuits has a square-shaped internal cell region 2 at its center area and a peripheral region surrounding the internal cell region 2. The peripheral region of the Bi-CMOS gate array semiconductor integrated circuit chip comprises an input/output circuit region 6 surrounding the internal cell region 2 and a bonding pad region 7 surrounding the input/output circuit region 6. The bonding pad region 7 includes discontinuous alignments of a plurality of bonding pads extending along each side of the chip, while the input/output circuit region 6 includes continuous alignments of a plurality of input/output circuits placed in parallel to the bonding pads.

The internal cell region 2 is divided into three regions or first to three regions 3, 4 and 5 having different internal cell structures from each other. The first internal cell structure regions 3 are distributed within the internal cell region 2 to form 2×2 matrix island arrays. The individual first internal cell structure regions 3 forming the 2×2 matrix island arrays are then spaced from one another. The individual first internal cell structure regions 3 may have various shapes and sizes, although the shape of each of the separately distributed first internal cell structure regions 3 is basically as square in a predetermined size. The second internal cell structure regions 4 are so distributed as to form square shaped loop band regions being so located as to surround the square shaped first internal cell structure regions forming the 2×2 matrix island arrays. The combinations of the first and second internal cell structure regions also constitute 2×2 matrix island arrays. The remaining region in the internal cell region 2 is shared by the third internal cell structure region 5 having cross-shaped portion which isolate the individual 2×2 matrix island arrays comprising the paired first and second internal cell structure regions 3 and 4 from each other. The cross-shaped portion of the third internal cell structure region 5 may correspond to cross-shaped wiring regions of the integrated circuits.

As described above, the first to third internal cell structure regions have the different cell structures from each other. The first internal cell structure region 3 may be the same structure as the first embodiment so as to have a suitable cell structure for performing logic operations in condition of extremely low load capacitance. Namely, as illustrated in FIG. 7A, the first internal cell structure region 3 comprises a large number of CMOS transistor cell units 12 involving six MOS transistors including CMOS circuits for logic operation and a small number of bipolar transistor cell units 13. The first internal cell structure region 2 has a ratio of 8:1 in the number of the CMOS cell units 12 to the bipolar transistor cell units 13. The first internal cell structure is suitable for the logic operations in an extremely low power consumption necessary for driving a very small load capacitance.

As illustrated in FIG. 7B, the second internal cell structure region 4 may have the same structure as the first embodiment to comprise the CMOS transistor cell units 12 and the bipolar transistor cell units 13 in which the number of the CMOS transistor cell units 12 is larger than the number of the bipolar transistor cell units 13. The second internal cell structure 4 has a ratio of 7:2 in the number of the CMOS cell units 12 to the bipolar transistor cell units 13. The second internal cell structure is suitable for the logic operations in a relatively low power consumption necessary for driving a relatively small load capacitance.

As illustrated in FIG. 7C, the third internal cell structure region 5 may have the same structure as the first embodiment to comprise the CMOS transistor cell units 12 and the bipolar transistor cell units 13 in which the number of the CMOS transistor cell units 12 is almost equal or near to the number of the bipolar transistor cell units 13. The third internal cell structure region has a ratio of 5:4 in the number of the CMOS cell units 12 to the bipolar transistor cell units 13. The third internal cell structure is suitable for the logic operations in a high power consumption necessary for driving a large load capacitance.

The majority of the first internal cell structure region 3 has the same circuit configuration as the first embodiment as illustrated in FIG. 8A in which paired p-channel and n-channel MOS transistors 8 and 10 constitute a CMOS circuit. The p-channel MOS transistor 8 has a gate connected to an input line, a source connected to a high voltage line and a drain connected to an output line, while the n-channel MOS transistor 10 has a gate connected to the input line, a source connected to a low voltage line and a drain connected to the output line.

Contrary to the above, the third internal cell structure region 5 has the same circuit configuration as the first embodiment as illustrated in FIG. 8B involving a CMOS circuit and a load driving circuit. For example, the circuit configuration of the third internal cell structure region comprises a pair of p-channel and n-channel MOS transistors 8 and 9 forming a CMOS circuit, a p-channel MOS transistor 10, two bipolar transistors 31 and 32 and a resistor 17. The p-channel MOS transistor 8 has a gate connected to an input line, a source connected to a high voltage line and a drain connected to a drain of the counterpart of the n-channel MOS transistor 9. The n-channel MOS transistor 9 has a gate connected to the input line, a source grounded and the drain connected to the drain of the p-channel MOS transistor 8. The p-channel MOS transistor 10 has a gate connected to the input line, a source connected through a resistance to a low voltage line and a drain connected to an output line. The bipolar transistor 31 has a base connected to the drains of the paired MOS transistors 8 and 9, a collector connected to the high voltage line and an emitter connected to an output line. The bipolar transistor 32 has a base connected to the source of the MOS transistor 10, a collector connected to the output line and an emitter connected to the low voltage line.

As described above, the first internal cell structure region 3 may preferably be allocated in the region conducting the logic operations in almost no or an extremely small power consumption due to driving almost no or a very low load resistance. The second internal cell structure region 4 may preferably be allocated in the region conducting the logic operations in a small power consumption due to driving a relatively low load resistance. By contrast, the third internal cell structure region 5 may preferably be allocated in the driving circuit region which requires the driving of the load capacitance or the resistance with a high power consumption for the logic operation. It could be appreciated from the above descriptions that the first and second internal cell structures includes a reduced number of the driving circuits involving the bipolar transistors and the resistor. This results in a considerable curtailment of an area of the internal cell region involved in the Bi-CMOS gate array semiconductor integrated circuit chip as a great number of the bipolar transistors sharing a relatively large area are reduced. This may permit a considerable increase of the number of the gate array logic circuits for the logic operation to replace the reduction of the considerable number of the bipolar transistors. Such internal cell structure may provide a considerable curtailment of a power consumption by the integrated circuit chip as a large number of the bipolar transistor are reduced. Particularly in the first and second internal cell structure regions 3 and 4, such internal cell structure may also prevent any delay in time of driving the driving circuits having the load capacitance and the resistance.

Similar to the first embodiment, even if the internal cell region includes a fewer number of bipolar transistors which are not operational as bipolar transistors, such inoperational bipolar transistors may be used as a capacitor with a circuit configuration reversely biased between high and low voltage lines involved in the integrated circuits as illustrated in FIG. 9. The unoperational bipolar transistors acting as the capacitor has a gate connected to the low voltage line and collector and emitter, both of which are connected to the high voltage line. The bipolar transistors acting as the capacitors may provide stability to the power. From the above descriptions, it could be understood that the reversely biased bipolar transistors acting as the capacitors in the novel internal cell structure may provide substantially no inoperational nor unnecessary element such as bipolar transistor.

Figure 6:
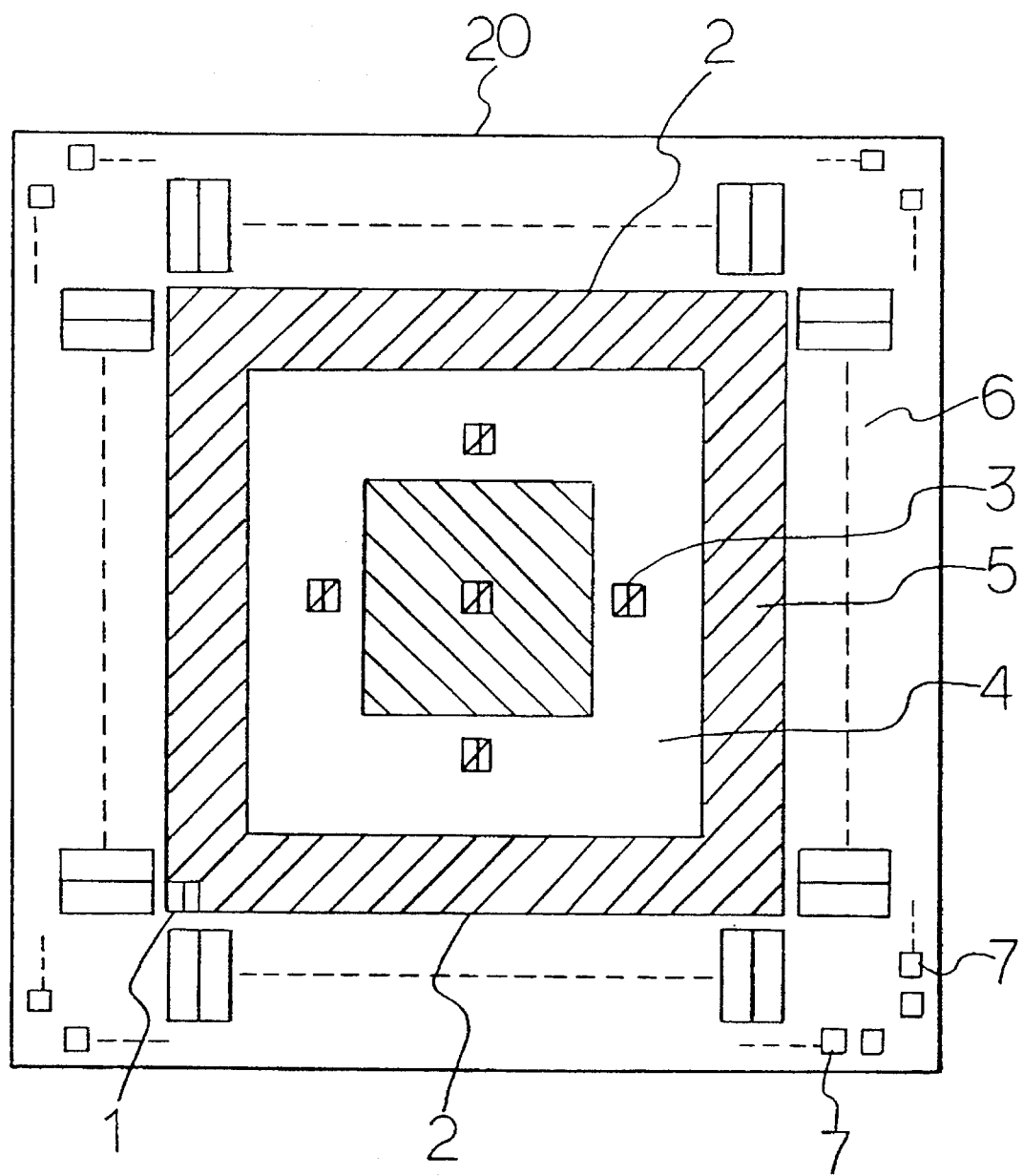
FIG. 6 is a diagram illustrative of a Bi-CMOS gate array LSI chip including a novel internal cell structure in an internal cell region involved in a Bi-CMOS gate array semiconductor integrated circuits in a third embodiment according to the present invention.

A third embodiment according to the present invention will be described in detail with reference to FIG. 6 in which a novel internal cell structure is provided for the Bi-CMOS gate array semiconductor integrated circuit chip.

The Bi-CMOS gate array semiconductor integrated circuits has a square-shaped internal cell region 2 at its center area and a peripheral region surrounding the internal cell region 2. The peripheral region of the Bi-CMOS gate array semiconductor integrated circuit chip comprises an input/output circuit region 6 surrounding the internal cell region 2 and a bonding pad region 7 surrounding the input/output circuit region 6. The bonding pad region 7 includes discontinuous alignments of a plurality of bonding pads extending along each side of the chip, while the input/output circuit region 6 includes continuous alignments of a plurality of input/output circuits placed in parallel to the bonding pads.

The internal cell region 2 is divided into three regions or first to three regions 3, 4 and 5 having different internal cell structures from each other. The first internal cell structure regions 3 are so distributed as to be divided into five separate portions which form a cross positioned at a center of the internal cell region 2. Namely, the first internal cell structure regions 3 comprises a first portion located at the center position, second and third portions spacely positioned on a vertical center line of the internal cell region 2 and fourth and fifth portions spacely positioned on a horizontal center line of the internal cell region 2. The individual first internal cell structure regions 3 forming the cross are then spaced from one another. The individual first internal cell structure regions 3 may have various shapes and sizes, although the shape of each of the separately distributed first internal cell structure regions 3 is basically as square in a predetermined size. The second internal cell structure regions 4 are so distributed as to include the second to fifth portions of the first internal cell structure region 3 but not including the first portion of the first internal cell structure region 3. The square shaped loop band region of the second internal cell structure region 4 has a square shaped loop internal boundary line spaced outward from the first center portion of the first internal cell structure region 3. The third internal cell structure region 5 comprises a peripheral region surrounding the second internal cell structure region 4 and a square shaped center region having an internal boundary enclosing the first center portion of the first internal cell structure region 3 and an external boundary surrounded by the second internal cell structure region 4.

As described above, the first to third internal cell structure regions have the different cell structures from each other. The first internal cell structure region 3 may be the same structure as the first embodiment so as to have a suitable cell structure for performing logic operations in condition of extremely low load capacitance. Namely, as illustrated in FIG. 7A, the first internal cell structure region 3 comprises a large number of CMOS transistor cell units 12 involving six MOS transistors including CMOS circuits for logic operation and a small number of bipolar transistor cell units 13. The first internal cell structure region 3 has a ratio of 8:1 in the number of the CMOS cell units 12 to the bipolar transistor cell units 13. The first internal cell structure is suitable for the logic operations in an extremely low power consumption necessary for driving a very small load capacitance.

As illustrated in FIG. 7B, the second internal cell structure region 4 may have the same structure as the first embodiment to comprise the CMOS transistor cell units 12 and the bipolar transistor cell units 13 in which the number of the CMOS transistor cell units 12 is larger than the number of the bipolar transistor cell units 13. The second internal cell structure 4 has a ratio of 7:2 in the number of the CMOS cell units 12 to the bipolar transistor cell units 13. The second internal cell structure is suitable for the logic operations in a relatively low power consumption necessary for driving a relatively small load capacitance.

As illustrated in FIG. 7C, the third internal cell structure region 5 may have the same structure as the first embodiment to comprise the CMOS transistor cell units 12 and the bipolar transistor cell units 13 in which the number of the CMOS transistor cell units 12 is almost equal or near to the number of the bipolar transistor cell units 13. The third internal cell structure region has a ratio of 5:4 in the number of the CMOS cell units 12 to the bipolar transistor cell units 13. The third internal cell structure is suitable for the logic operations in a high power consumption necessary for driving a large load capacitance.

The majority of the first internal cell structure region 3 has the same circuit configuration as the first embodiment as illustrated in FIG. 8A in which paired p-channel and n-channel MOS transistors 8 and 10 constitute a CMOS circuit. The p-channel MOS transistor 8 has a gate connected to an input line, a source connected to a high voltage line and a drain connected to an output line, while the n-channel MOS transistor 10 has a gate connected to the input line, a source connected to a low voltage line and a drain connected to the output line.

Contrary to the above, the third internal cell structure region 5 has the same circuit configuration as the first embodiment as illustrated in FIG. 8B involving a CMOS circuit and a load driving circuit. For example, the circuit configuration of the third internal cell structure region comprises a pair of p-channel and n-channel MOS transistors 8 and 9 forming a CMOS circuit, a p-channel MOS transistor 10, two bipolar transistors 31 and 32 and a resistor 17. The p-channel MOS transistor 8 has a gate connected to an input line, a source connected to a high voltage line and a drain connected to a drain of the counterpart of the n-channel MOS transistor 9. The n-channel MOS transistor 9 has a gate connected to the input line, a source grounded and the drain connected to the drain of the p-channel MOS transistor 8. The p-channel MOS transistor 10 has a gate connected to the input line, a source connected through a resistor to a low voltage line and a drain connected to an output line. The bipolar transistor 31 has a base connected to the drains of the paired MOS transistors 8 and 9, a collector connected to the high voltage line and an emitter connected to an output line. The bipolar transistor 32 has a base connected to the source of the MOS transistor 10, a collector connected to the output line and an emitter connected to the low voltage line.

As described above, the first internal cell structure region 3 may preferably be allocated in the region conducting the logic operations in almost no or an extremely small power consumption due to driving almost no or a very low load resistance. The second internal cell structure region 4 may preferably be allocated in the region conducting the logic operations in a small power consumption due to driving a relatively low load resistance. By contrast, the third internal cell structure region 5 may preferably be allocated in the driving circuit region which requires the driving of the load capacitance or the resistance with a high power consumption for the logic operation. It could be appreciated from the above descriptions that the first and second internal cell structures includes a reduced number of the driving circuits involving the bipolar transistors and the resistor. This results in a considerable curtailment of an area of the internal cell region involved in the Bi-CMOS gate array semiconductor integrated circuit chip as a great number of the bipolar transistors sharing a relatively large area are reduced. This may permit a considerable increase of the number of the gate array logic circuits for the logic operation in replace of the reduction of the considerable number of the bipolar transistors. Such the internal cell structure may provide a considerable curtailment of a power consumption by the integrated circuit chip as a large number of the bipolar transistor are reduced. Particularly in the first and second internal cell structure regions 3 and 4, such the internal cell structure may also prevent any delay in time of driving the driving circuits having the load capacitance and the resistance.

Similar to the first embodiment, even if the internal cell region includes a slight number of bipolar transistors which are not operational as bipolar transistors, such inoperational bipolar transistors may be used as a capacitor with a circuit configuration reversely biased between high and low voltage lines involved in the integrated circuits as illustrated in FIG. 9. The unoperational bipolar transistors 41 and 42 acting as the capacitor has a gate connected to the low voltage line and source and drain, both of which are connected to the high voltage line. The bipolar transistors acting as the capacitors may provide a stability to the power. From the above descriptions, it could be understood that the reversely biased bipolar transistors acting as the capacitors in the novel internal cell structure may provide substantially no inoperational nor unnecessary element such as bipolar transistor.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by the claims all modifications of the invention which fall within the sprit and scope of the invention.

What is claimed is:

1. An internal cell structure contained within an internal cell region of a semiconductor integrated circuit, comprising:

a plurality of MOS transistor cell units each including a plurality of MOS transistors; and a plurality of bipolar junction transistor cell units each including a plurality of bipolar junction transistors;

whereby a distribution ratio is obtained by comparing a number of said plurality of MOS transistor cell units to a number of said plurality of bipolar junction transistor cell units;

wherein said internal cell region comprises:

a first region having a high distribution ratio;

a third region having a low distribution ratio; and a second region having an intermediate distribution ratio which is lower in distribution ratio than said high distribution ratio and higher in distribution ratio than said low distribution ratio.

2. The internal cell structure as claimed in claim 1, wherein said high distribution ratio is 8:1;

said intermediate distribution ratio is 7:2; and said low distribution ratio is 5:4.

3. The internal cell structure as claimed in claim 1, wherein said first region is distributed to form matrix like island arrays;

said second region is distributed to form square-shaped loops surrounding said matrix like island arrays of said first region; and said third region is distributed to share the remaining area of said internal cell region.

4. The internal cell structure as claimed in claim 1, wherein said first region comprises a plurality of sub-regions disposed at a center position and four other positions symmetrically spaced from said center position of said internal cell region;

said second region is distributed to form a single large square-shaped loop having an external boundary line encompassing said first region and an internal boundary line spaced from said center position so as not to encompass said four symmetrical positions; and said third region is distributed to share the remaining area of said internal cell region.

5. The internal cell structure as claimed in claim 1, wherein each of said MOS transistor cell units includes six MOS transistors and comprising two CMOS circuits.

6. The internal cell structure as claimed in claim 1, wherein each of said bipolar junction transistor cell units includes two bipolar junction transistors and a resistor.

7. The internal cell structure as claimed in claim 1, wherein said internal cell structure has at least one of said bipolar junction transistor cell units including a bipolar junction transistor in which a base is connected to a low voltage line and a collector and an emitter are connected to a high voltage line being connected to a power source to permit said bipolar junction transistor to function as a capacitor.

8. A Bi-CMOS gate array semiconductor integrated circuit chip, comprising:

a peripheral region comprising an input/output circuit region and a bonding pad region;

an internal cell structure contained with an internal cell region, comprising:

a plurality of MOS transistor cell units each including a plurality of MOS transistors; and a plurality of bipolar junction transistor cell units each including a plurality of bipolar junction transistors;

whereby a distribution ratio is obtained by comparing a number of said plurality of MOS transistor cell units to a number of said plurality of bipolar junction transistor cell units;

wherein said internal cell region comprises:

a first region having a high distribution ratio;

a third region having a low distribution ratio; and a second region having an intermediate distribution ratio which is lower in distribution ratio than said high distribution ratio and higher in distribution ratio than said low distribution ratio.

9. The Bi-CMOS gate array semiconductor integrated circuit chip as claimed in claim 8, wherein:

said high distribution ratio is 8:1;

said intermediate distribution ratio is 7:2; and said low distribution ratio is 5:4.

10. The Bi-CMOS gate array semiconductor integrated circuit chip as claimed in claim 8, wherein:

said first region is distributed to form matrix like island arrays;

said second region is distributed to form square-shaped loops surrounding said matrix like island arrays of said first region; and said third region is distributed to share the remaining area of said internal cell region.

11. The Bi-CMOS gate array semiconductor integrated circuit chip as claimed in claim 8, wherein said first region comprises a plurality of sub-regions disposed at a center position and four other positions symmetrically spaced from said center position of said internal cell region;

said second region is distributed to form a single large square-shaped loop having an external boundary line encompassing said first region and an internal boundary line being spaced apart from said center position so as not to encompass said four symmetrical positions; and said third region is distributed to share the remaining area of said internal cell region.

12. The Bi-CMOS gate array semiconductor integrated circuit chip as claimed in claim 8, wherein each of said MOS transistor cell units includes six MOS transistors and comprises two CMOS circuits.

13. The Bi-CMOS gate array semiconductor integrated circuit chip as claimed in claim 8, wherein each of said bipolar transistor cell units includes two bipolar junction transistors and a resistor.

14. The Bi-CMOS gate array semiconductor integrated circuit chip as claimed in claim 8, wherein said internal cell structure has at least one of said bipolar junction transistor cell units including a bipolar junction transistor in which a base is connected to a low voltage line and a collector and an emitter are connected to a high voltage line being connected to a power source to permit said bipolar junction transistor to function as a capacitor.

* * * * *